United States Patent
Hsieh et al.

(10) Patent No.: US 6,572,278 B2
(45) Date of Patent: Jun. 3, 2003

(54) OPTO-ELECTRONIC DEVICE HAVING STAKED CONNECTION BETWEEN PARTS TO PREVENT DIFFERENTIAL THERMAL EXPANSION

(75) Inventors: Yung-Chieh Hsieh, San Jose, CA (US); Eric B. Grann, San Ramon, CA (US)

(73) Assignee: Blaze Network Products, Inc., Pleasanton, CA (US)

(*) Notice: Subject to any disclaimer, the term of this patent is extended or adjusted under 35 U.S.C. 154(b) by 170 days.

(21) Appl. No.: 09/805,513

(22) Filed: Mar. 12, 2001

(65) Prior Publication Data

US 2002/0018635 A1 Feb. 14, 2002

Related U.S. Application Data

(63) Continuation-in-part of application No. 09/347,490, filed on Jul. 2, 1999, now Pat. No. 6,201,908.

(51) Int. Cl.[7] ................................................ G02B 6/00
(52) U.S. Cl. .......................................... 385/88; 385/137
(58) Field of Search ........................ 385/39, 51, 53–94, 385/136, 137, 139, 147

(56) References Cited

U.S. PATENT DOCUMENTS

| | | | | |
|---|---|---|---|---|
| 4,733,932 A | * | 3/1988 | Frenkel et al. | 385/92 |
| 5,436,997 A | * | 7/1995 | Makiuchi et al. | 385/92 |
| 5,594,829 A | * | 1/1997 | LoStracco et al. | 385/134 |
| 5,905,836 A | * | 5/1999 | Arai et al. | 385/120 |
| 6,456,766 B1 | * | 9/2002 | Shaw et al. | 385/47 |
| 6,483,968 B2 | * | 11/2002 | Fuse et al. | 385/49 |

* cited by examiner

Primary Examiner—Rodney Bovernick
Assistant Examiner—Michelle R. Connelly-Cushwa
(74) Attorney, Agent, or Firm—Bruce H. Johnsonbaugh

(57) ABSTRACT

An opto-electronic device is provided wherein an optical assembly having a first coefficient of thermal expansion is connected to a substrate having a second, different coefficient of thermal expansion. A plurality of stakes are either separately inserted or integrally formed in the optical assembly and extend through and are adhesively bonded to passageways formed in the substrate. The stakes reduce or prevent differential thermal expansion that would otherwise occur as the device heats up during operation. The substrate may be thermally connected to a metallic housing for the device to increase transfer of unwanted heat into the ambient atmosphere.

11 Claims, 6 Drawing Sheets

OPTO-ELECTRONIC DEVICE HAVING STAKED CONNECTION BETWEEN PARTS TO PREVENT DIFFERENTIAL THERMAL EXPANSION

CROSS-REFERENCE TO RELATED APPLICATION

This is a continuation-in-part of U.S. patent application Ser. No. 09/347,490 filed Jul. 2, 1999; now U.S. Pat. No. 6,201,908.

BACKGROUND AND BRIEF SUMMARY OF THE INVENTION

The present invention relates generally to opto-electronic devices subject to differential thermal expansion. More specifically, the present invention provides a solution to the problem of differential thermal expansion of adjacent WDM components and of adjacent parallel optical links components. Differential thermal expansion is particularly troublesome where the expansion directly disturbs the optical pathway of the assembled opto-electronic device.

The present invention is particularly effective in preventing differential thermal expansion which otherwise would disturb the optical pathway in the multiplexer/demultiplexer design shown and described in U.S. application Ser. No. 09/347,490, which is incorporated by reference herein as though set forth in full. The problem of differential thermal expansion becomes quite significant as WDM devices and other opto-electronic devices are downsized. The miniaturized WDM device utilizes a zigzag optical pathway requiring precise relative location of lenses, filters, lasers and photodetectors. Any differential thermal expansion which disturbs the relative location of those critical elements in the optical pathway has a severe effect on the performance of the assembled device. A contributing factor is that major components of miniaturized WDM devices have increased performance potential if materials can be used having different thermal coefficients of expansion. For example, major optical components are preferably made of molded plastic, which is not an efficient thermal conductor or heat sink. Materials such as ceramic, which are relatively efficient thermal conductors and heat sinks, have significantly different and smaller coefficients of thermal expansion as compared to molded plastic.

According to one embodiment of the present invention, a ceramic substrate is utilized in a miniaturized WDM device to support heat generating components such as lasers, laser driver chips and photodetectors. The ceramic substrate in the preferred embodiment is adhesively bonded to a metallic housing for the WDM device. Heat is efficient transferred from the heat source to the ceramic substrate and thence preferably to a metallic housing and into the ambient air. In order to reduce or prevent differential thermal expansion between the ceramic substrate and the molded plastic component to which it is connected, a plurality of sturdy molded stakes protrude from the plastic component and extend through and are adhesively bonded to holes in the ceramic substrate. As the assembled device heats up during operation, the plastic (having a much higher thermal coefficient to expansion than the ceramic) tends to expand faster than the ceramic substrate. However, that differential expansion is reduced or prevented by the stakes. Internal compressive stresses are generated within the plastic component, but those compressive stresses are tolerated by the plastic and the optical pathway is not disturbed.

A second embodiment of the invention applies to parallel optical links such as an optic coupler wherein a laser/detector array is mounted on a substrate or board and wherein the optic coupler is staked to the substrate or board supporting the laser or detector array.

A primary object of the invention is to reduce or prevent differential thermal expansion which would otherwise adversely affect the optical pathway of an opto-electronic device, such as a WDM device or an optic coupler.

A further object of the invention is to utilize a substrate to carry one or more heat generating components of an opto-electronic device, and to connect the substrate to an optical assembly in a manner which reduces or prevents differential thermal expansion between the substrate and optical assembly.

Another object of the invention is to provide a molded plastic optical assembly having a plurality of molded plastic stakes extending through and adhesively bonded to a substrate to reduce or prevent differential thermal expansion.

A further object is to provide a miniaturized WDM device having molded plastic components carried in a metallic housing wherein heat is efficiently transferred from a heat generating source carried on a substrate to said metallic housing, and said substrate is connected to said molded plastic component in a manner to reduce or prevent differential thermal expansion.

Other objects and advantages will become apparent from the following description and the drawings wherein:

DETAILED DESCRIPTION OF THE DRAWINGS

Figure 1:
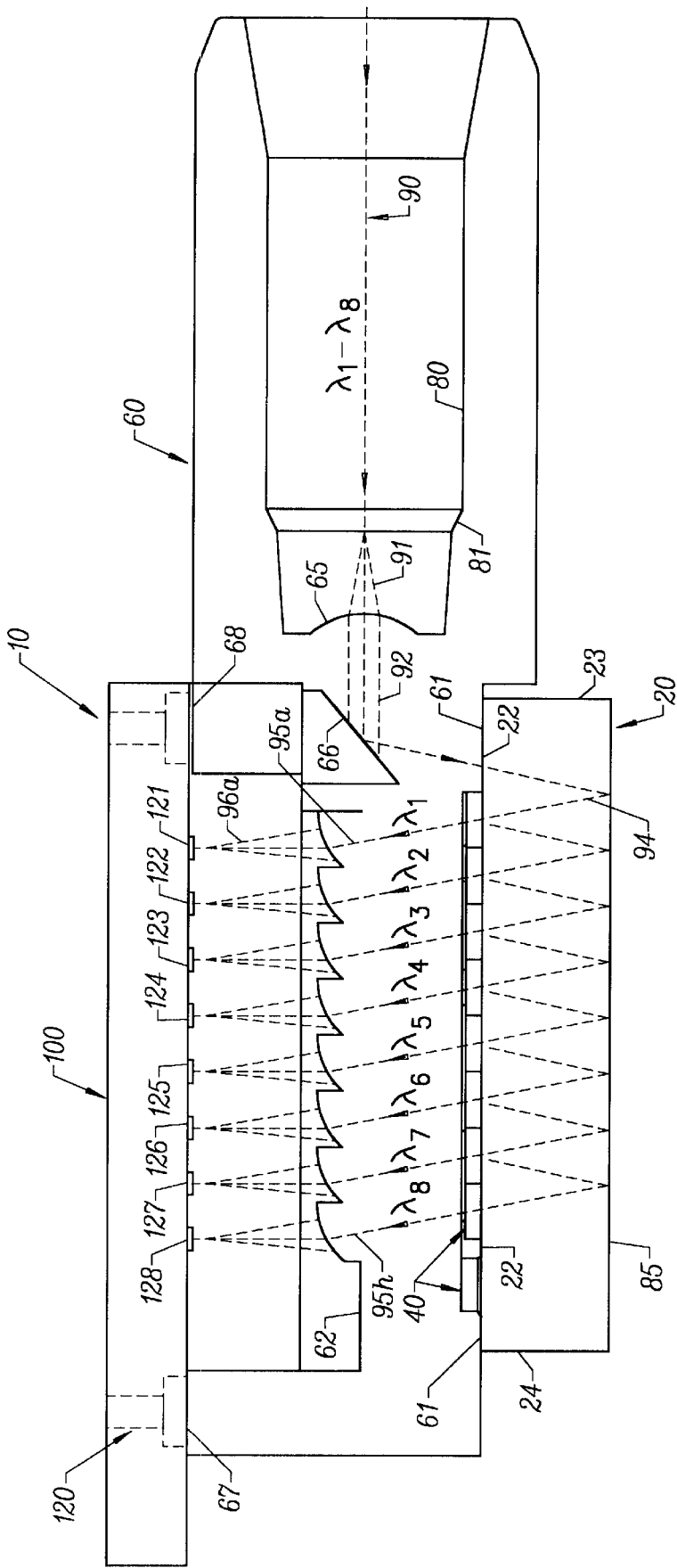
FIG. 1 shows a cross section side view of a WDM optical multiplexer/demultiplexer using the present invention.

FIG. 1 shows the major optical components of the wavelength division multiplexer/demultiplexer 10 which utilizes the present invention. The device has three primary components bonded together; an optical block 20, a molded coupling module 60 and a substrate 100. A more detailed description of the device shown in FIG. 1 (without substrate 100) is contain ed in application Ser. No. 09/347,490. A portion of that description is repeated here for convenience. The device shown in FIG. 1 has the ability to combine individual light signals into a single optical path which can be directed towards an optical fiber, and/or demultiplex such signals into individual channels. For simplicity of explanation, the demultiplexing functionality is described, since those skilled in the art will readily understand the correlative multiplexing functionality.

FIG. 1 shows the assembled primary components and illustrates the optical pathway 90–96 wherein an incoming signal includes eight separate wavelengths (n wavelengths in the general case), which are separated into eight separate channels to be read by photodetectors 121–128. In the multiplexing mode of the invention, lasers replace photodetectors 121–128. An optical block 20 formed of glass or molded of plastic is shown with a plurality of filters 40 carried on surface 22. The optical block 20 has an outer flat surface 21 which is coated with a reflective material 85.

A molded coupling module 60 has a first flat surface 61 which is adhesively connected to the flat inner surface 22 of optical block 20.

The molded coupling module 60 in the embodiment illustrated in FIG. 1 includes a fiber optic cable receptacle 80 integrally molded therein for receiving the end of a fiber optic cable (not shown) so that the end of the cable engages receptacle seat 81.

As illustrated in FIG. 1, a multiplexed optical beam having 8 wavelengths $\lambda_1$–$\lambda_8$ moves along optical pathway 90, exits the end of the fiber optic cable (not shown) and begins to diverge as shown at 91. An integrally molded collimating lens 65 collimates the diverging light beam 91 and forms a collimated beam 92. The collimated light beam 92 is reflected off integrally formed reflective surface 66 of the molded coupling module 60 and is directed toward the reflective coating 85 carried by the flat outer surface 21 of the optical block 20. As the light beam moves through that section 93 of the optical pathway, it impinges against the reflective coating 85 at a predetermined angle of incidence. The reflected beam 94 is reflected in a zigzag pattern in optical block 20 between the plurality of n filters 40 and the reflective surface 85. As the reflected beam enters each of the n filters, one of the n different wavelengths of light is transmitted through each filter and the separated wavelengths move along the optical pathways 95a through 95h toward the plurality of molded aspheric surfaces 70 formed on second surface 62 of the molded coupling module 60. Each of the n aspheric molded surfaces focuses the separated wavelength bands or channels, as shown for example as 96a, onto separate photodetectors 121–128, as known in the art.

As shown in FIG. 1, the optical block 20 is generally rectangular in shape having flat outer and inner surfaces 21 and 22, a flat proximal end wall 23 and a flat distal wall 24. The optical block in the preferred embodiment of the invention is formed from a high quality optical glass. Alternately, the optical block 20 may be injection molded using high quality optical plastic. The reflective coating 85 is applied to the outer surface 21 of block 20. The reflective coating may be formed of materials conventionally used in this art, such as dielectric interference coatings or metallic coatings.

The optical block 20 has a reflective coating on one side and an array 40 of discrete multiwavelength Fabry-Perot transmission filters on the other side. The precision optical block 20 can be formed of any transparent optical material capable of transmitting light over the desired spectral region and being formed or polished to the correct thickness. The reflective surface 85 can be placed on the optical block by a number of techniques, to include; dielectric interference coatings, metallic coatings, etc.

The plurality of n filters 40 includes eight discrete Fabry-Perot filters mounted on the flat inner surface 22 of optical block 20.

The assembly of the filter array onto the optical block and then the adhesive bonding of the optical block 20 to the molded coupling module 60 achieves a passive optical alignment of the critical optical elements of the device. When assembled as described above, the output beam 91 of the fiber optic cable is directly coupled to the wavelength division multiplexer/demultiplexer 10 and is automatically and passively aligned with the internal optics of the device, including the collimating lens 65, the beam reflection means, the reflective coating 85 on the top surface of optical block 20 as well as with the plurality of filters 40 and the plurality of aspheric surfaces 70. No postfabrication alignment or tuning or adjustment of these optical elements is required.

Figure 2:
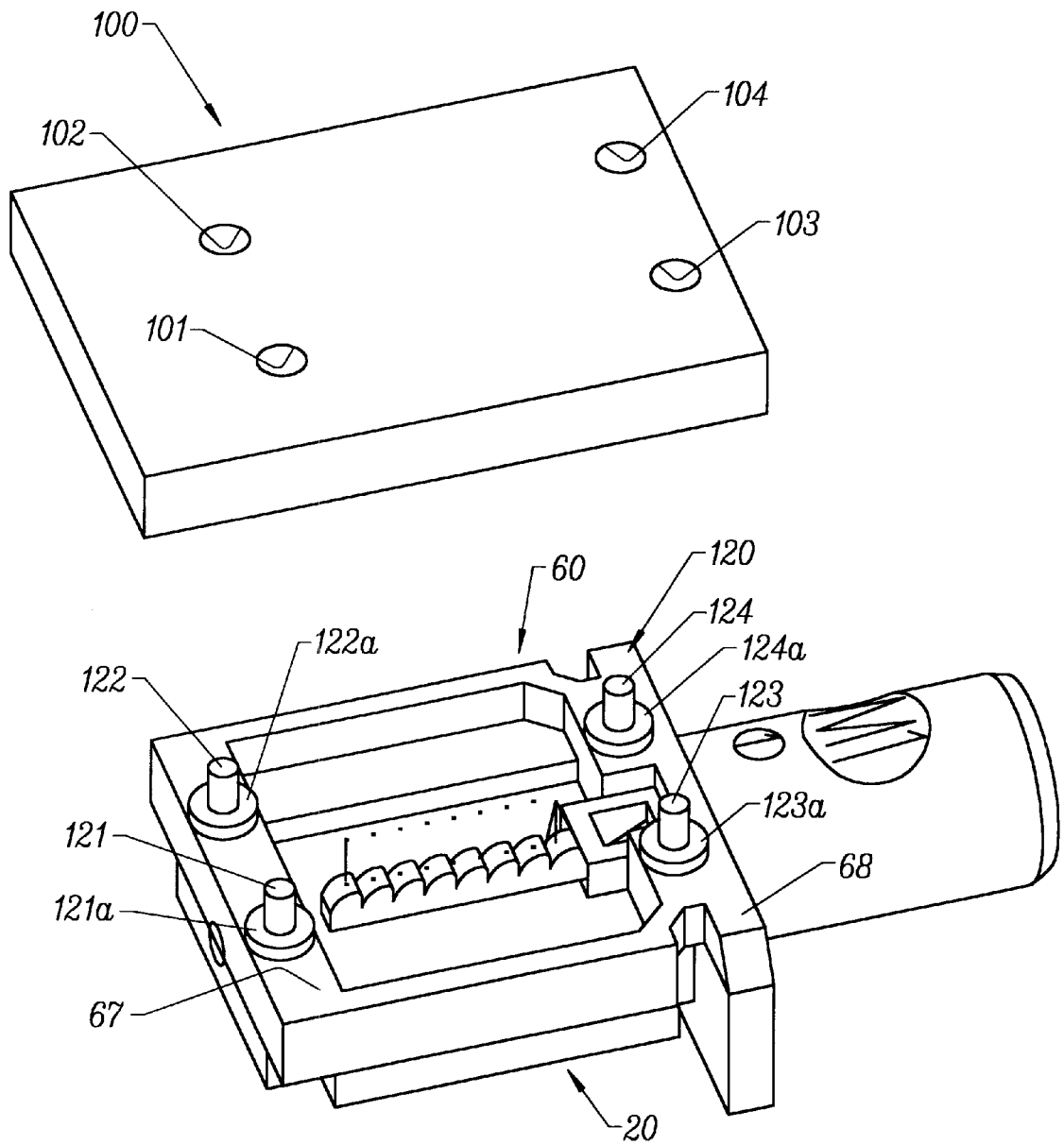
FIG. 2 is a perspective view showing in exploded fashion the device of FIG. 1.

Substrate 100 is connected to first and second mounting surfaces 67 and 68 of molded coupling module 60 (FIGS. 1 and 2). Substrate 100 may be ceramic or other material, preferably with relatively high thermal conductivity. Stake means 120 rigidly connects substrate 100 to molded coupling module 60 to reduce or prevent differential thermal expansion between the substrate and module. FIG. 2 illustrates the preferred form of stake means 120 wherein four cylindrical stakes or projections 121,122,123 and 124 are integrally molded with coupling module 60. Each stake or projection 121–124 preferably includes an enlarged base 121a–124a, respectively. The purpose of enlarged bases 121a–124a is to increase the ability of each stake 121–124 to bear the shear and bending loads caused as the plastic molded coupling module 60 heats up during operation and tends to expand at a faster rate than substrate 100.

Substrate 100 has passageways 101,102,103,104 formed therein to receive stakes or projections 121–124, respectively. Passageways 101–104 are countersunk with recesses 101a–104a (FIG. 1) to receive enlarged bases 121a–124a, respectively.

Figure 3:
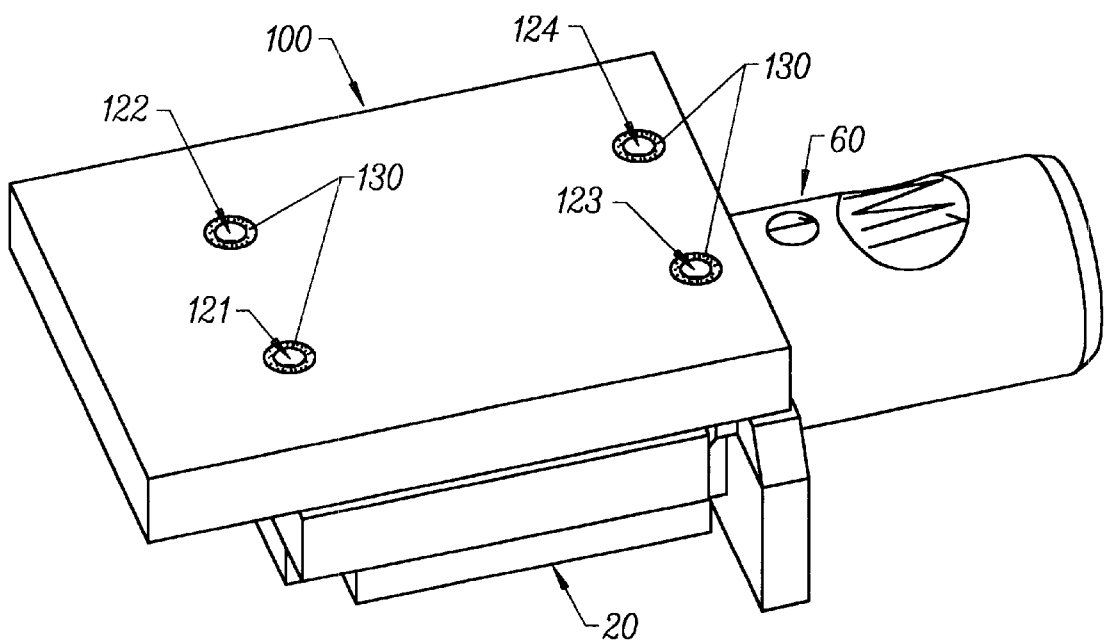
FIG. 3 is a perspective view showing the assembled device of FIGS. 1 and 2.

The clearance between passageways 101–104 and stakes 121–124 is preferably 25–30 microns. Epoxy 130 (FIG. 3) is the preferred adhesive used to bond the stakes 121–124 into passageways 101–104.

Figure 4:
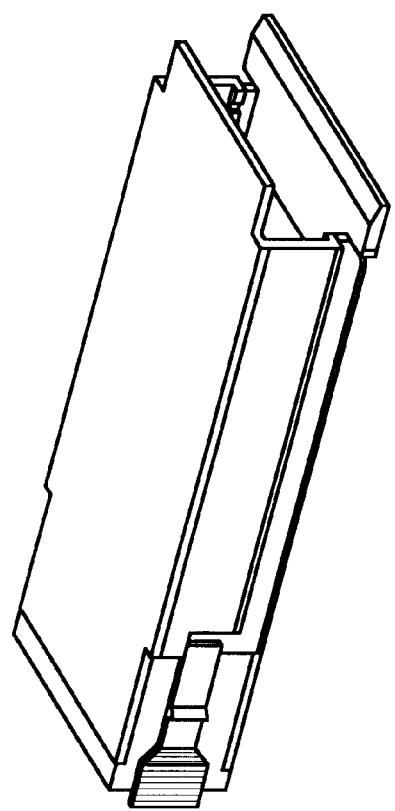
FIG. 4 is a perspective view showing the assembled device of FIGS. 1–3 mounted in a pluggable housing.
Figure 4:
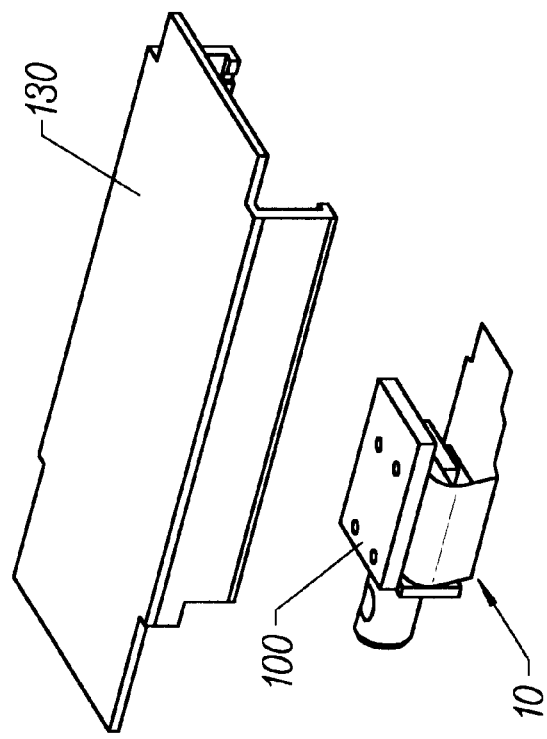

As shown in FIG. 4, the optical sub-assembly (OSA) 10 may be mounted in a GBIC (gigabit interface converter) compatible housing having a metallic cover 130. Ceramic substrate 100 is thermally connected to cover 130 by heat conducting adhesive, for example. The heat generated by components carried on substrate 100 is efficiently transferred to substrate 100, to metallic cover 130 and into ambient atmosphere. Efficient heat transfer in this manner improves the operating characteristics of the assembled WDM and extends its useful lifetime.

Alternate forms of stake means 120 may be used. For example, the stakes may be metal pins, or dowels formed of high strength material, and bonded to holes formed in module 60 and substrate 100. Different shapes may be used for each stake, such as square, rectangular, elliptical and other shapes. The number of stakes and placement of stakes may also be varied without departing from the invention. The stake means 120 may be used in alternate WDM designs wherein differential thermal expansion may be reduced or prevented.

Figure 5:
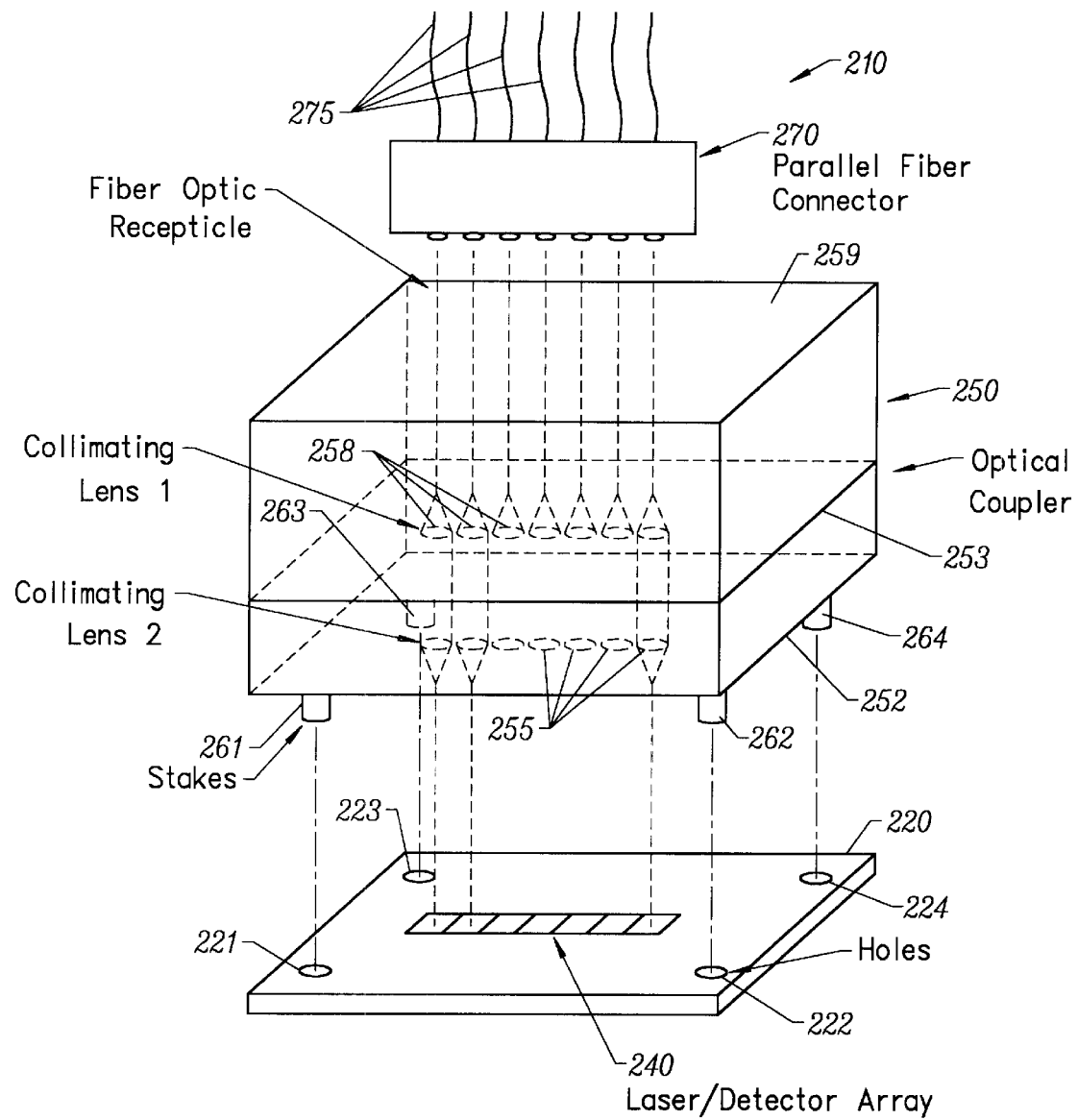
FIG. 5 is a schematic representation of an optic coupler according to the invention.
Figure 6:
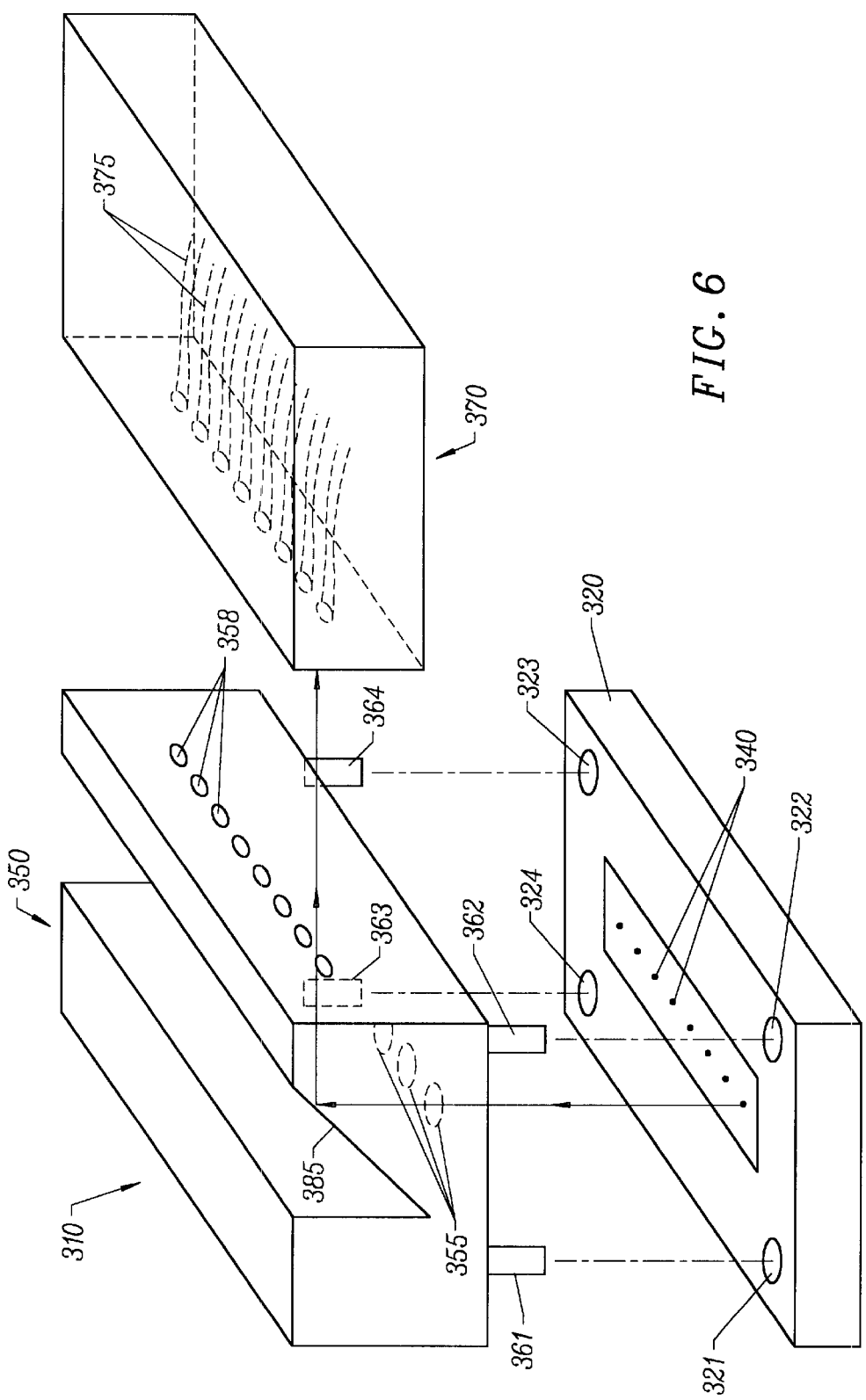
FIG. 6 is a schematic representation of an alternate form of optic coupler according to the invention.

FIGS. 5 and 6 illustrate two embodiment of parallel optical links shown generally as 210 and 310, respectively. FIG. 5 shows a substrate 220 which carries an array of, for example, eight lasers or photodetectors 240. Substrate 220 may be ceramic or other relatively good heat conducting material. An optical coupler 250 carries a plurality of collimating lenses 255, for example, eight collimators, one for each laser or detector 240, on its first surface 252, which is positioned adjacent substrate 220. A second series of collimating lenses 258 are carried by a second surface 253. The upper portion 259 of coupler 250 forms a fiber optic receptacle, into which a parallel fiber connector 270 is received. Fiber connector 270 has eight fibers 275 which are positioned to carry optical signals to and from the plurality of lasers or photodetectors 240.

Stakes 261–264 extend between substrate 220 and optical coupler 250. As used in the claims, the phrase "optical assembly" refers to optical coupler 250 and collimating lenses 255 and 258. Stakes 261–264 extend into and are epoxy bonded to holes 221–224 in substrate 220. Stakes 261–264 reduce or prevent differential thermal expansion that would otherwise occur between substrate 220 and the "optical assembly" formed by optical coupler 250 and lens arrays 255 and 258.

FIG. 6 shows an alternate form of parallel optical link similar to that shown in FIG. 5, except FIG. 6 includes a ninety degree bend in the optical pathway. FIG. 6 has similar reference numerals to FIG. 5 in the 300 series. Substrate 320 carries a plurality of lasers/detectors 340. Optical coupler 350 carries a first set of collimating lenses 355 and a second set of lenses 358 carried at ninety degrees with respect to lenses 355. Turning mirror 385 carried by coupler 350 and mounted at forty-five degrees relative to the laser/detector optical axis achieves the ninety degree turn. Parallel fiber cable connector 370 with parallel fibers 375 is attached to coupler 350. Stakes 361–364 connect coupler 350 to substrate 320 by engaging holes 321–324 formed in substrate 320.

The "optical assembly" in the embodiment shown in FIGS. 1–4 is the optical subassembly 10.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. In an opto-electronic device having a substrate supporting one or more elements and having an optical assembly carried by said substrate, and wherein said optical assembly and said substrate have different coefficients of thermal expansion, the improvement comprising:

stake means rigidly connecting said substrate to said optical assembly to reduce or prevent differential thermal expansion that would otherwise occur, wherein the stake means include metal pins or dowels formed of high strength material, and bonded to holes in the substrate.

2. The apparatus of claim 1 wherein said optical assembly is plastic and said substrate is ceramic.

3. The apparatus of claim 1 wherein said optical assembly is an optical coupler and said substrate carries a plurality of either lasers or detectors.

4. The apparatus of claim 3 wherein said optical coupler includes a plurality of collimating lenses and a turning mirror connectable to a parallel fiber cable.

5. The apparatus of claim 3 wherein said optical coupler includes a plurality of collimating lenses connectable to a parallel fiber cable.

6. The apparatus of claim 1 wherein said optical assembly is an optical WDM and wherein said substrate carries a plurality of either lasers or photodetectors.

7. In an optical wavelength division multiplexer or demultiplexer for single-mode or multi-mode fiber optic communication systems, wherein n channels are transmitted through a single fiber optic cable having n different wavelengths and wherein the optical pathway through the device passes through a molded coupling module and onto a substrate connected to said molded coupling module, and wherein said molded coupling module and said substrate have different coefficients of thermal expansion, the improvement comprising:

stake means rigidly connecting said substrate to said molded coupling module to reduce or prevent differential thermal expansion that would otherwise occur, wherein said stake means comprises a plurality of cylindrical projections integrally molded with and extending outwardly from said molded coupling module.

8. The apparatus of claim 7 wherein said molded coupling module is plastic and said substrate is ceramic.

9. The apparatus of claim 8 wherein said ceramic substrate is thermally connected to a metallic housing for the WDM device.

10. The apparatus of claim 9 wherein said metallic housing is a GBIC standard size and is adapted to comply with GBIC specifications.

11. The apparatus of claim 7 wherein each of said cylindrical projections has an enlarged base to increase its resistance to shear and bending loads caused by differential thermal expansion between said substrate and said molded coupling module.

* * * * *